United States Patent
Kubo et al.

(10) Patent No.: US 9,674,953 B2
(45) Date of Patent: Jun. 6, 2017

(54) FINE SILVER PARTICLE INK, FINE SILVER PARTICLE SINTERED BODY, AND METHOD FOR PRODUCING FINE SILVER PARTICLE INK

(71) Applicant: TANAKA KIKINZOKU KOGYO K.K., Tokyo (JP)

(72) Inventors: Hitoshi Kubo, Tsukuba (JP); Yusuke Ohshima, Tsukuba (JP); Noriaki Nakamura, Tsukuba (JP); Hiroshi Noguchi, Tsukuba (JP); Junichi Taniuchi, Tsukuba (JP); Yuichi Makita, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 52 days.

(21) Appl. No.: 14/614,196

(22) PCT Filed: Jul. 11, 2013

(86) PCT No.: PCT/JP2013/068991
§ 371 (c)(1),
(2) Date: Feb. 4, 2015

(87) PCT Pub. No.: WO2014/024630
PCT Pub. Date: Feb. 13, 2014

(65) Prior Publication Data
US 2015/0245480 A1    Aug. 27, 2015

(30) Foreign Application Priority Data
Aug. 7, 2012 (JP) .................... 2012-175456

(51) Int. Cl.
| | |
|---|---|
| H05K 1/09 | (2006.01) |
| H01B 1/22 | (2006.01) |
| B22F 1/00 | (2006.01) |
| C09D 11/52 | (2014.01) |
| B22F 9/30 | (2006.01) |

(52) U.S. Cl.
CPC .......... H05K 1/097 (2013.01); B22F 1/0062 (2013.01); B22F 9/30 (2013.01); C09D 11/52 (2013.01); H01B 1/22 (2013.01); *B22F 2001/0066* (2013.01); *B22F 2998/10* (2013.01); *Y10T 428/268* (2015.01)

(58) Field of Classification Search
CPC ......... H05K 1/097; B22F 1/0062; B22F 9/30; B22F 2001/0066; B22F 2998/10; C09D 11/52; H01B 1/22; Y10T 428/268
See application file for complete search history.

(56) References Cited

U.S. PATENT DOCUMENTS

2012/0043510 A1    2/2012  Kurihara et al.

FOREIGN PATENT DOCUMENTS

| CN | 102395439 A | 3/2012 |
|---|---|---|
| JP | 2002-121606 A | 4/2002 |
| JP | 2005-36309 A | 2/2005 |
| JP | 2008-214695 A | 9/2008 |
| JP | 2010-265543 A | 11/2010 |
| JP | 2012-52225 A | 3/2012 |
| JP | 2012-207049 A | 10/2012 |
| WO | WO 2010/119630 A1 | 10/2010 |
| WO | WO 2012/105682 A1 | 8/2012 |
| WO | WO 2013/105530 A1 | 7/2013 |
| WO | WO 2013/105531 A1 | 7/2013 |
| WO | WO 2013/115300 A1 | 8/2013 |

OTHER PUBLICATIONS

PCT, English translation of the International Preliminary Report on Patentability, Feb. 19, 2015.
PCT, International Search Report, PCT/JP2013/068991, Sep. 3, 2013.
EPO, European Search Report for EP13827960.9, Jun. 28, 2016.
Itoh, Mitsunori et al "Direct Transformation into Silver Nanoparticles via Thermal Decomposition of Oxalate-Bridging Silver Oleylamine Complexes", Journal of Nanoscience and Nanotechnology, vol. 9, No. 11, Nov. 1, 2009.

*Primary Examiner* — Robert Jones, Jr.
(74) *Attorney, Agent, or Firm* — Orrick Herrington & Sutcliffe, LLP

(57) ABSTRACT

Provided are a fine silver particle ink composed of hexylamine, dodecylamine, oleic acid, fine silver particles and a solvent, in which the volume resistivity of a sintered body at 100° C. obtained after the ink is applied on a substrate by spin coating is 8 to 25 μΩcm, a sintered body thereof, and a method for producing a fine silver particle ink. When a fine silver particle ink containing coated fine silver particles is produced by a silver-amine complex decomposition method, production can be carried out smoothly. The fine silver particle ink can be sintered even at a low temperature, and a sintered body thereof has a mirror surface and low volume resistance.

6 Claims, 6 Drawing Sheets

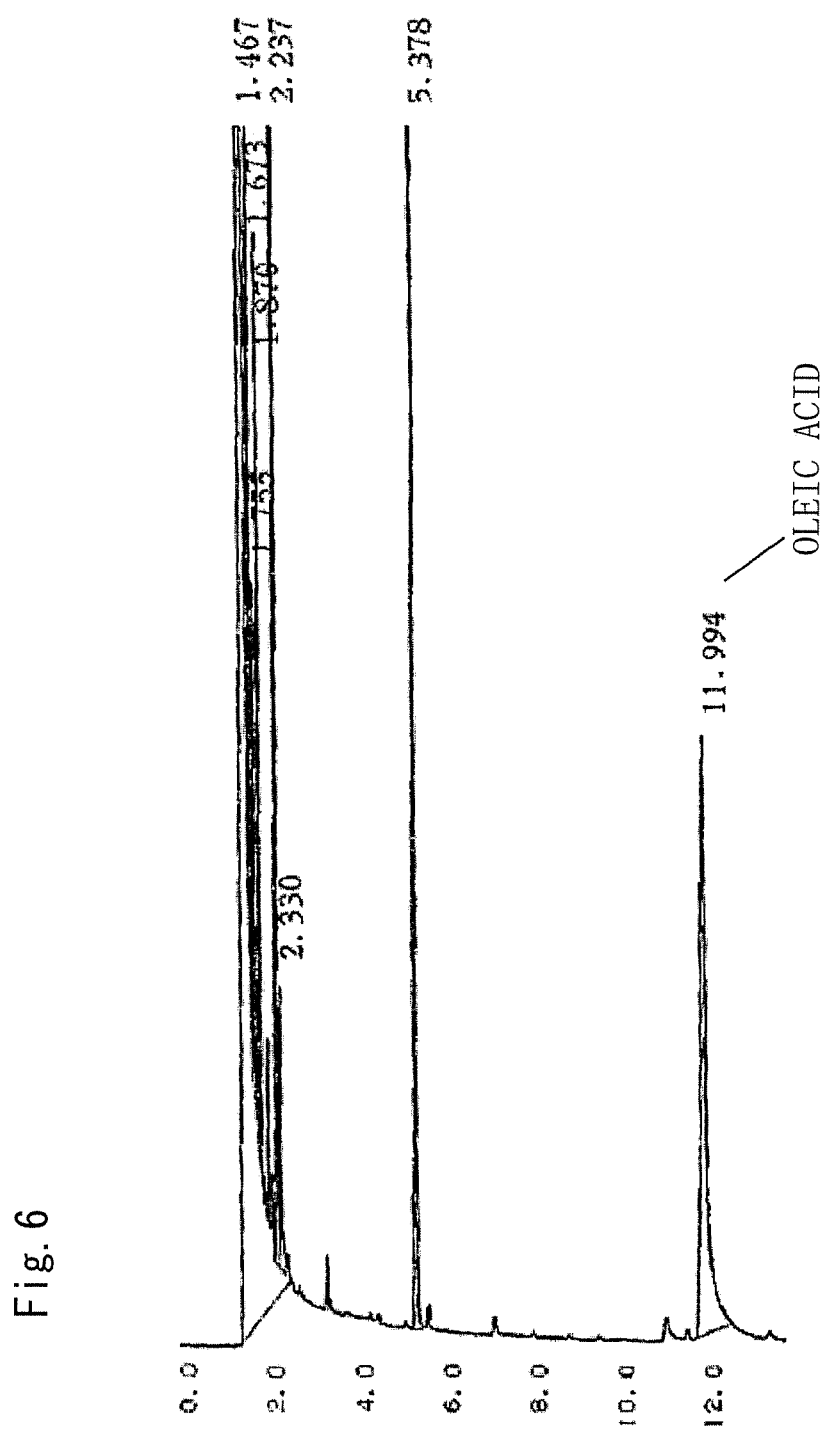

FINE SILVER PARTICLE INK, FINE SILVER PARTICLE SINTERED BODY, AND METHOD FOR PRODUCING FINE SILVER PARTICLE INK

TECHNICAL FIELD

The present invention relates to a method for producing a fine silver particle ink containing nanometer-sized coated fine silver particles that exhibit satisfactory electrical conductivity on a substrate or the like as a result of low temperature sintering, a fine silver particle ink produced by the relevant method, and a fine silver particle sintered body.

BACKGROUND ART

For example, in regard to a printed wiring board for mounting electronic components, there has been a demand for speeding up and density increase in the mounting of materials for forming electroconductive wiring, along with the requests for size reduction, thickness reduction, and weight reduction of electronic equipment and an enhancement of productivity.

In this regard, attempts have been made to form silver wiring at lower temperatures using an ink having nano-sized fine silver particles dispersed therein, for example, by an inkjet printing technology.

In this case, printing a desired circuit shape using an ink containing fine silver particles, and binding the fine silver particles in the coating film by sintering to obtain a thin film may be considered; however, in view of the heat resistance of substrates, there is a demand for a fine silver particle-containing ink that can be sintered at a temperature close to 100° C. Furthermore, since silver wiring is used, lower volume resistance is demanded, and in order to do so, it is demanded that the surface be as smooth as possible.

For example, Patent Document 1 suggests an ultrafine metal particle dispersion liquid in which fluidity is maintained even at a high concentration, and ultrafine metal particles can be flocculated and concentrated, and a method for production thereof.

This is an ultrafine metal particle dispersion liquid in which ultrafine metal particles having a particle size of 100 nm or less are dispersed, using one or more of an alkylamine, a carboxylic acid amide, and an aminocarboxylic acid as dispersants.

However, this Patent Document 1 has no disclosure on the sintering temperature, and when the inventors of the present invention conducted an experiment, it was found that a sintering temperature far higher than 100° C. was needed.

Furthermore, Patent Document 2 discloses a method for producing an ultrafine silver particle colloid by mixing a silver salt, a reducing agent that does not exhibit a reducing ability in an organic solvent, and an alkylamine in an organic solvent.

It is said that this ultrafine silver particle colloid has an average particle size of 1 to 20 nm and is monodisperse, the particles are polygonal and have a uniform shape, and the colloid is suitable as a material for a low temperature sinterable saline paste or the like. However, there is no disclosure on a specific sintering temperature, and according to an experiment of the inventors of the present invention, the sintering temperature was definitely far higher than 100° C. as expected.

Furthermore, there is no disclosure on the surface roughness of the sintered bodies of Patent Documents 1 and 2, and it has been confirmed that both have matte surfaces, and the volume resistance of the sintered bodies are more than 30 μΩ·cm at a film thickness of about 500 nm in terms of weight.

CITATION LIST

Patent Document

Patent Document 1: JP 2002-121606 A
Patent Document 2: JP 2005-36309 A
Patent Document 3: JP 2010-265543 A

DISCLOSURE OF THE INVENTION

Problem to be Solved by the Invention

An object of the present invention is to provide a fine silver particle ink that can be sintered at a low temperature of about 100° C. and also gives a sintered body having a smooth surface, a fine silver particle sintered body, and a method for producing a fine silver particle ink.

Means for Solving Problem

The present invention is to solve the problems described above by providing a fine silver particle ink composed of hexylamine, dodecylamine, oleic acid, fine silver particles, and a solvent, which is characterized in that after the fine silver particle ink is applied on a substrate by spin coating, the volume resistivity of a sintered body at 100° C. is 8 to 25 μΩ·cm.

The problems described above can be solved by means of a fine silver particle sintered body having a mirror surface, which is formed by applying a fine silver particle ink such as described above, and then sintering the ink at 100° C.

Furthermore, in regard to the invention of a production method, the problems described above can be solved by a method for producing a fine silver particle ink, in which the method includes a first step of kneading silver oxalate and N,N-dimethyl-1,3-diaminopropane; a second step of kneading the kneading product obtained in the first step with hexylamine, dodecylamine, and oleic acid, and thereby forming a silver complex; a third step of heating and stirring the silver complex, and thereby producing fine silver particles; and a dispersion step of dispersing the fine silver particles obtained in the third step in a solvent, and thereby forming an ink.

Effect of the Invention

The fine silver particle ink according to the present invention can have a mirror surface by forming a film by spin coating at room temperature, and sintering the film at a low temperature. Furthermore, the sintered body has low volume resistivity, and the fine silver particle ink enables the formation of an electroconductive film or an electroconductive wiring even on a substrate having low heat resistance.

Furthermore, according to the method of the present invention, a fine silver particle ink which can be sintered at a low temperature while setting the room temperature retention time for a coating film to zero or for 5 minutes, can be produced.

BRIEF DESCRIPTION OF DRAWINGS

FIG. 6 is a gas chromatographic chart diagram at the time of oleic acid quantification of a coated fine silver particle ink produced by the present invention.

MODE(S) FOR CARRYING OUT THE INVENTION

Figure 1:
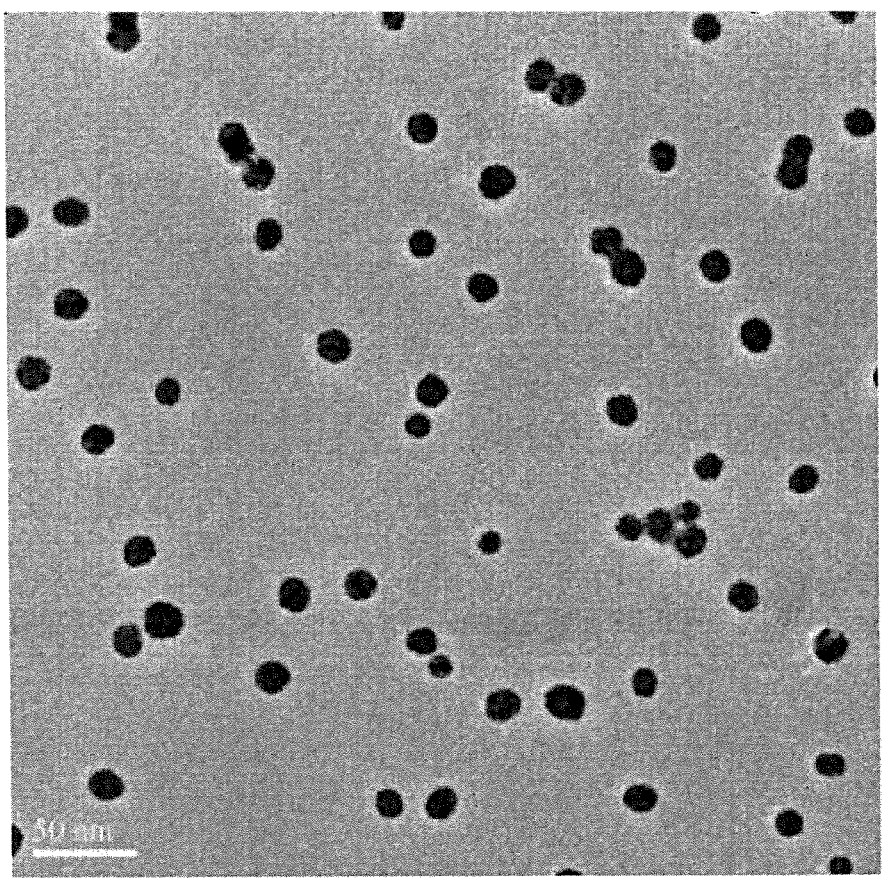
FIG. 1 is a transmission electron microscopic (TEM) image of coated fine silver particles produced by the present invention.

Hereinafter, the method for producing coated fine silver particles according to the present invention, a fine silver particle ink produced by the method according to the present invention, and a sintered body of these fine silver particles will be described.

It is known that an ink containing fine silver particles protected by a protective film of an alkylamine is produced by heating a complex compound formed from a silver compound such as silver oxalate and an alkylamine in the presence of an alkylamine, and aggregating atomic silver that is generated by decomposing the silver compound of oxalic acid ion contained in the relevant complex compound.

In the first step according to an exemplary embodiment of the present invention, silver oxalate that has been wetted in advance by 30 to 200 wt % of a solvent such as decane or methanol, and an alkyldiamine including N,N-dimethyl-1,3-diaminopropane are kneaded. Completion of this kneading is determined based on whether the complex compound (silver complex) to be purified exhibits a color corresponding to the constituent component thereof.

In the second step, hexylamine, dodecylamine and oleic acid are added to the kneading product obtained in the first step.

Next, in the third step, the silver complex is heated and stirred at 110° C. During this heating and stirring, when the cream colored silver complex gradually turns brown and further changes to black, purification of the fine silver particles can be confirmed. In this third step, gas bubbles are generated from the reaction system, and the time point at which these gas bubbles are no longer generated is considered as the end point of the reaction induced by heating and stirring.

In a centrifugation process, an alcohol such as methanol is added to the reaction system of the third step (matrix containing fine silver particles), the mixture is sufficiently stirred, and this mixture is supplied to a centrifuge.

Since fine silver particles do not dissolve in methanol, the fine silver particles are precipitated by centrifugation and separated from the methanol solution. At this time, since the diamine that has not adsorbed to the fine silver particles as a protective agent, hexylamine, dodecylamine and oleic acid are dissolved in methanol, when the supernatant generated by centrifugation is removed, any excess amounts of these organic protective agents that are not dissolved can be separated.

Purification of fine silver particles by this addition of methanol and centrifugation is carried out at least two times, and thus fine silver particles are obtained as a precipitate.

The dispersion step involves dispersing the fine silver particles that have been obtained from the centrifugation process, in a solvent to form an ink. For example, a silver ink is obtained by dissolving the fine silver particles in a mixed solvent of octane and butanol (4:1) to be a silver concentration of 20 to 50 wt %. The mixed solvent may include trace amounts of hexylamine, dodecylamine, and oleic acid.

When silver oxalate is wetted in advance with a solvent, a rapid decomposition reaction of the silver compound or evaporation of the constituent components of the alkylamine can be suppressed at the time of kneading of the silver oxalate and alkylamine. When the amount of the solvent is less than 30 wt %, the suppressive effect is insufficient, and when the amount of the solvent is more than 200 wt %, excessive suppression occurs.

In addition, if kneading is possible in the first step, it is not essential to wet the silver oxalate. However, in this case, precise control is required for the kneading, such as by kneading small amounts of silver oxalate and the alkylamine several times.

When coated fine silver particles are produced, silver carboxylate, silver chloride, silver nitrate or the like can be used as the silver compound; however, from the viewpoint that metallic silver is easily purified by decomposition, and impurities other than silver are not easily generated, silver oxalate is preferred.

As described above, the silver concentration in the coated fine silver particles is determined by subjecting the silver precipitate obtained after methanol washing in the centrifugation process, to a TG-DTA analysis (thermogravimetry-differential, thermal analysis). Furthermore, in regard to the composition of the protective agent present in a fine silver particle ink, an analysis of the amine component can be carried out by directly feeding a fine silver particle ink obtained as a final product, to a gas chromatography system having a FID (hydrogen flame ionization detector) capillary column.

The molar ratio of hexylamine with respect to dodecylamine finally included in the fine silver particle ink is 3:1 to 60:1, and is preferably in the range of 3:1 to 9:1. Furthermore, the amount of oleic acid included in the fine silver particle ink is 0.02 to 0.30 mmol/g relative to the weight of silver. If the ratio exceeds the range described above, film formation may be achieved incompletely, the volume resistance of the sintered body may be large, or an ink having poor uniformity of fine silver particles may be obtained.

Film formation using the fine silver particle ink obtained after the various processes described above can be achieved by, for example, rotating a base material (substrate) such as a PET (polyethylene terephthalate) film, and then spin coating the fine silver particle ink by dropping the ink onto the base material. The silver film thus formed is dried, together with the base material, in air at room temperature for about 5 minutes, and then is sintered by heating at 100° C. using a dryer.

At this time, an optimal sintering time can be determined by measuring the volume resistance of the film at every hour. Also, the film thickness of the sintered silver can be calculated by SEM observation.

Regarding the solvent in the dispersion step, for example, a mixed solution of n-octane and n-butanol is preferred for the dispersion of coated fine silver particles.

According to the present invention, since silver oxalate is wetted by a solvent before being mixed with an alkylamine, when silver oxalate is mixed with N,N-dimethyl-1,3-diaminopropane, the decomposition reaction of silver oxalate and evaporation of the constituent components of the alkylamine can be sufficiently suppressed, and the reaction proceeds uniformly. Thus, a N,N-dimethyl-1,3-diaminopropane-coordinated silver complex is produced.

Furthermore, also in the second step of adding hexylamine, dodecylamine and oleic acid to the N,N-dimethyl-1,3-diaminopropane-coordinated silver complex, the composition of the protective agent on the surface of the silver particles thus produced is made uniform by the presence of the solvent.

In a case in which there is no solvent, when the N,N-dimethyl-1,3-diaminopropane-coordinated silver complex is produced, a solid that is difficult to stir is formed. Thus, even if hexylamine, dodecylamine, and oleic acid are added to this solid so as to produce silver particles, since this leads to a reaction between a solid and a liquid, the reaction proceeds only at the interface thereof, and the system becomes non-uniform. Therefore, fluctuation occurs in the composition of the protective agent that adsorbs to the individual fine silver particles. For example, when there are particles that are rich in dodecylamine having a large carbon number on the surface, it is contemplated that at the time of sintering, the sintering time is lengthened because dodecylamine has a high boiling point. Furthermore, it is expected that sintering may be achieved with difficulties because the protective agent film is stabilized due to the hydrophobic interaction between dodecyl groups.

As a result, although the correct reason was not clearly understood, as soon as the fine silver particle ink was applied on a PET substrate (about for 0 to 5 minutes), the fine silver particle ink could be sintered at a low temperature such as 100° C. Also, the sintered body had a mirror surface, and satisfactory results such as a volume resistance of 12 $\mu\Omega\cdot cm$ or less were obtained. Furthermore, when the fine silver particle ink was applied on a substrate and baked at 200° C., the volume resistance of the baked product was 2 $\mu\Omega\cdot cm$ or less.

EXAMPLES

Hereinafter, Examples of the present invention will be specifically described.

A fine silver particle ink according to the Examples was produced as follows.

In the first step, N,N-dimethyl-1,3-diaminopropane was kneaded together with silver oxalate that had been wetted by 30 to 200 wt % of an organic solvent, and thus a N,N-dimethyl-1,3-diaminopropane-coordinated silver complex was formed. In the second step, hexylamine (carbon number: 6), dodecylamine (carbon number: 12), and oleic acid (carbon number: 19) as a fatty acid were added to the mixture of the first step, and the resulting mixture was kneaded.

More specifically, in the first step, silver oxalate was synthesized from silver nitrate and oxalic acid dihydrate, and an organic solvent was added to this silver oxalate. In the present Example, an alkylamine was added such that the total number of moles of the alkylamine would be approximately 4 to 6 times the molar amount of silver oxalate. Since two silver atoms are present in a molecule of silver oxalate, the amount of the alkylamine corresponds to 2 to 3 times the molar amount based on silver atoms. Specifically, the amount of silver oxalate wetted with 30 wt % of an organic solvent was 2.17 g (Ag=10.0 mmol), and the amount of N,N-dimethyl-1,3-diaminopropane was 0.78 g (7.61 mmol).

After the introduction of silver oxalate, the mixture was kneaded until a creamy state was obtained at room temperature, and thereby silver oxalate was changed to a white substance. Then, kneading was terminated at a time point at which the relevant change was acknowledged to be seemingly completed.

In the second step, 1.16 g (11.42 mmol) of n-hexylamine and 0.18 g (0.95 mmol) of n-dodecylamine were added to the mixture of the first step, and 0.042 g≈44.9 μL of oleic acid (1.5 mol % with respect to Ag) was further added thereto. This mixture was kneaded until a creamy state was obtained at room temperature, and similarly to the first step, kneading was terminated at a time point at which the change was acknowledged to be seemingly completed.

To a viscous white substance obtained as described above, diethyl ether capable of dissolving an alkylamine was added, and thereby unreacted alkylamine that was not bound to the white substance was separated and removed. Subsequently, the IR spectrum (infrared absorption spectrum) of the remaining white substance was measured, and absorption attributable to the alkyl chain of the alkylamine was observed. From this, the white substance obtained as described above was found to be a product formed as silver oxalate and an alkylamine were bonded, and it was speculated that the white substance was a complex compound formed as the amino groups of the alkylamine are coordination bonded to the silver atoms of silver oxalate.

In the third step, the complex compound thus obtained was transferred to an oil bath, and heating and kneading was carried out at a temperature set to 100° C. Immediately after the initiation of kneading, a reaction accompanied by generation of carbon dioxide was initiated, and thereafter, kneading was carried out until the generation of carbon dioxide was completed. Thereby, a suspension liquid in which fine silver particles exhibiting blue gloss were suspended in an amine mixture was obtained.

Next, in the centrifugation process, in order to substitute the dispersing medium of the suspension liquid, 4 g of methanol was added to the suspension liquid, and the mixture was then stirred. Subsequently, the fine silver particles were precipitated by centrifugation, and were separated by removing the supernatant. 4 g of methanol was added again to the separated fine silver particles, and the mixture was subjected to stirring and centrifugation. Thereby, fine silver particles were precipitated and separated.

In the dispersion step, a mixed solvent of n-butanol and n-octane (volume ratio 1:4) was added to the fine silver particles and dissolved the fine silver particles such that the silver concentration after mixing was 1 to 50 wt %, and preferably 20 to 50 wt %. Thus, a fine silver particle ink in which dark yellow orange-colored coated fine silver particles were independently dispersed was obtained. This dark yellow orange color represents that in regard to the coated fine silver particles thus produced, the surface atoms of the fine silver particles were in a metallic state without forming a compound or the like, and thereby the coated fine silver particles exhibit a surface plasmon band with a maximum wavelength of about 396 mm that is attributable to metal silver; and that the fine silver nanoparticles are independently dispersed in the solvent. In addition, it is also acceptable to use a solvent other than n-butanol and n-octane, for example, pentanol or decane.

A TEM photograph of the fine silver particle ink is shown in FIG. 1. It can be seen from FIG. 1 that the fine silver particles are satisfactorily dispersed, and the particle size is in the range of 10 to 15 nm.

The silver concentration in the fine silver particles was determined by subjecting the precipitate obtained after methanol washing, to a TG-DTA analysis.

Also, an analysis of the amine component was carried out by producing fine silver particle inks by dissolving an Ag precipitate that had been centrifuged after adding methanol in various solvents, and feeding the inks directly to a gas chromatographic system (GC) having an FID capillary column. Thus, the composition of the protective agent that was adsorbed to the fine silver particles was investigated.

Figure 2:
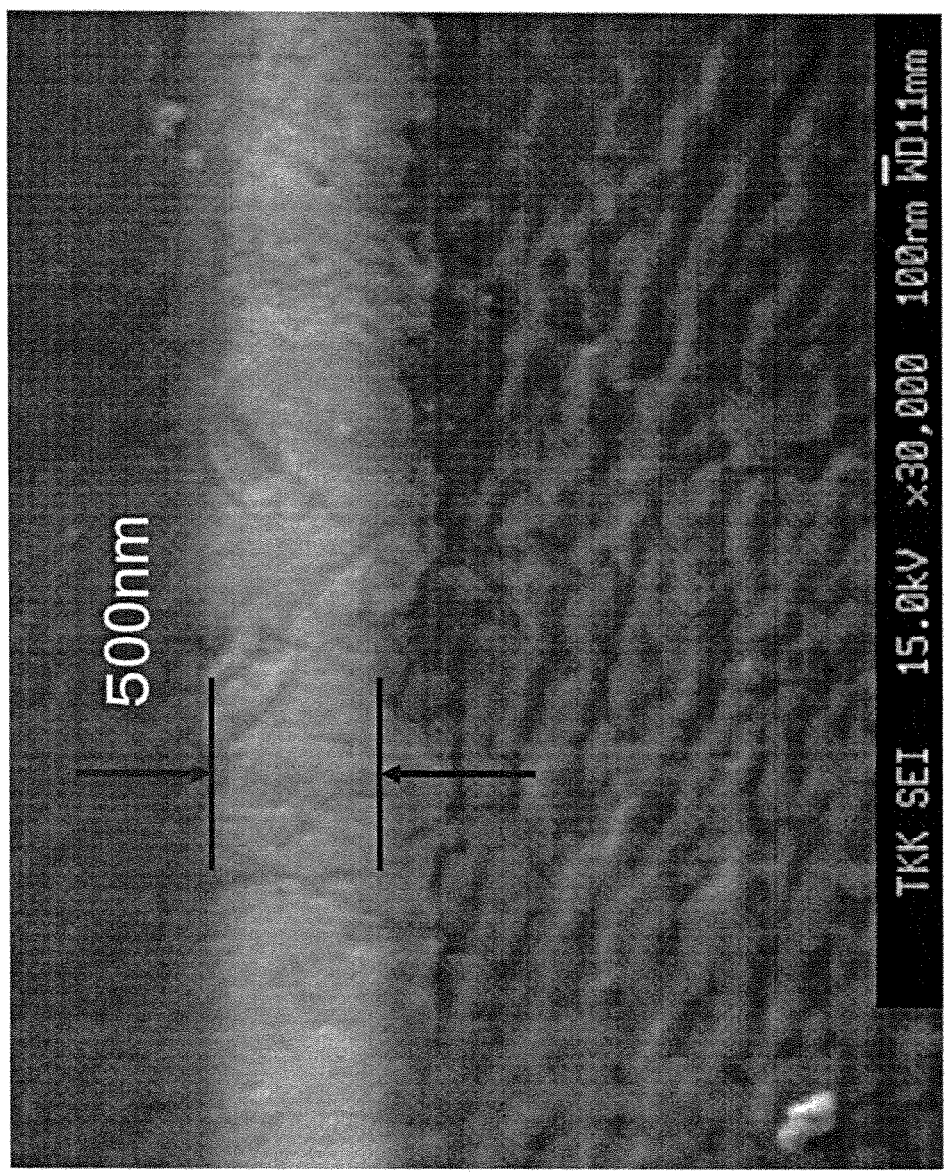
FIG. 2 is a scanning electron microscopic (SEM) image of a cross-section of a sintered film (sintered body) of coated fine silver particles produced by the present invention.

Furthermore, a film of silver was formed on PET by spin coating the present fine silver particle ink (dropping the Ag ink on a PET film that was rotated at 1000 to 2000). The silver-coated PET film thus obtained was embedded in resin, and subsequently a silver coating film cross-section was obtained by polishing. A SEM observation of this cross-section was conducted, and the film thickness was measured. The film thicknesses of various silver coating films were about 500 nm (FIG. 2). The electrical resistances of the silver films were measured at various heating times. The electrical resistance was carried out by a four-probe method (Loresta-GP Mitsubishi Chemical Analytech). The volume resistance was calculated from the film thickness of the silver coating film estimated from the SEM observation.

Figure 3:
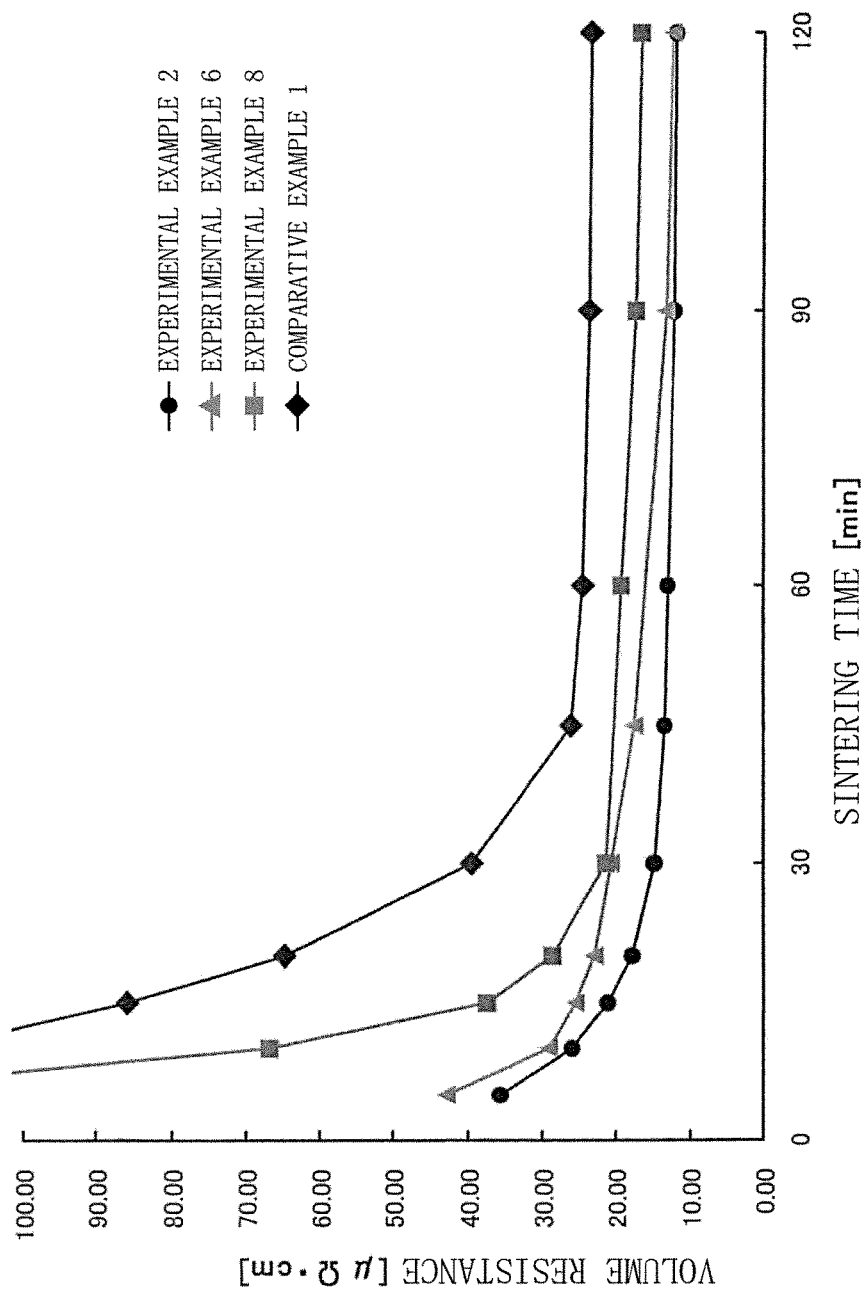
FIG. 3 is a line diagram illustrating the relationship between the sintering time and the volume resistance in a sintered film (sintered body) of coated fine silver particles produced by the present invention.
Figure 4:
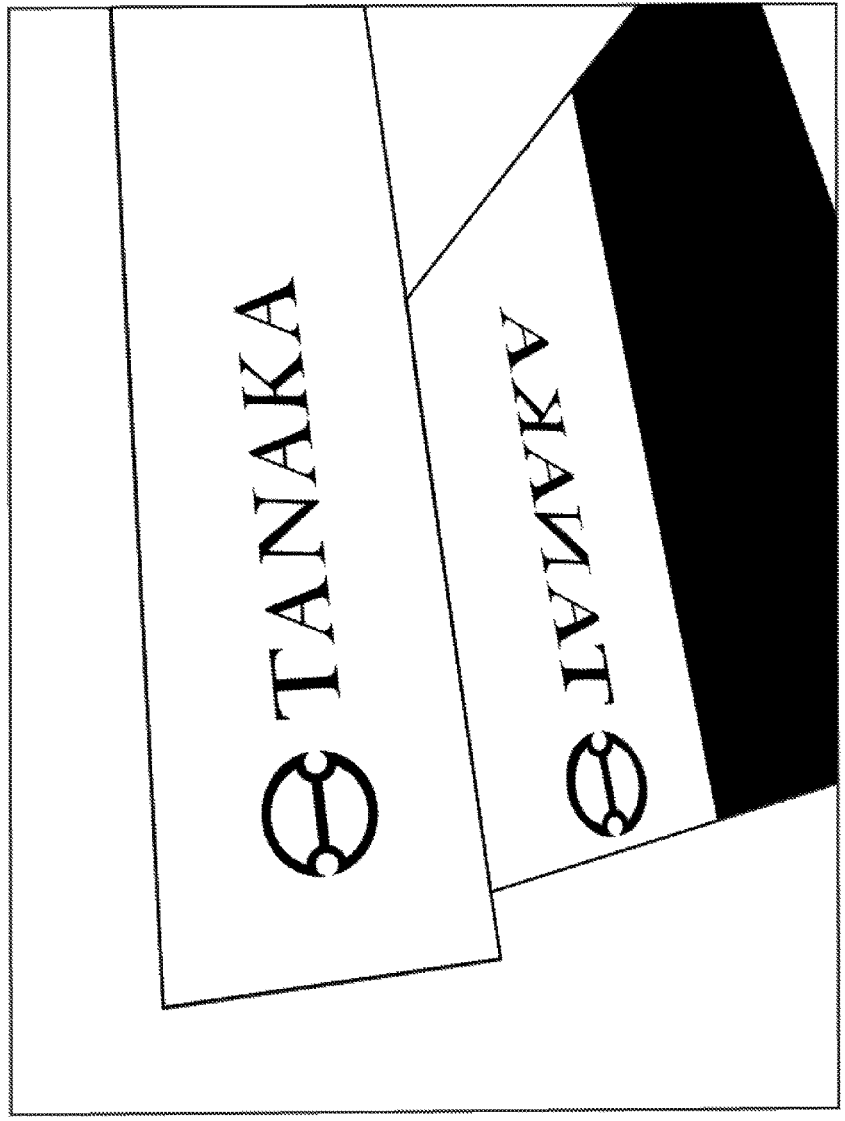
FIG. 4 is a line drawing showing a mirror image at the mirror surface of the same sintered film.

FIG. 3 shows the relationship between the baking time and the measured values of volume resistance in a case in which films of the fine silver particle inks produced in the following Experimental Examples 2, 6 and 8 and Comparative Example 1 were produced by spin coating and sintered (film thickness 500 nm) at a baking temperature of 100° C. The minimum value of the volume resistance was 12 μΩ·cm under heating at 100° C., and the minimum value was 2 μΩ·cm under heating at 200° C.

EXPERIMENTAL EXAMPLES

Experimental Examples 1 to 15 are described in Table 1. Also, Comparative Examples 1 to 8 are described in Table 2.

TABLE 1

| | Solvent for synthesis | Solvent of ink | Amount of addition mmol | | | | Production of fine silver particles | Stability of ink |
| --- | --- | --- | --- | --- | --- | --- | --- | --- |
| | | | Diamine | Hexylamine | Dodecylamine | Oleic acid | | |
| Experimental Example 1 | Methanol | Octane butanol 4:1 | 7.61 | 11.42 | 0.95 | 0.15 | ○ | ○ |
| Experimental Example 2 | n-Hexane | Octane butanol 4:1 | 7.61 | 11.42 | 0.95 | 0.15 | ○ | ○ |
| Experimental Example 3 | Toluene | Octane butanol 4:1 | 7.61 | 11.42 | 0.95 | 0.15 | ○ | ○ |
| Experimental Example 4 | n-Butanol | Octane butanol 4:1 | 7.61 | 11.42 | 0.95 | 0.15 | ○ | ○ |
| Experimental Example 5 | n-Octane | Octane butanol 4:1 | 7.61 | 11.42 | 0.95 | 0.15 | ○ | ○ |
| Experimental Example 6 | n-Decane | Octane butanol 4:1 | 7.61 | 11.42 | 0.95 | 0.15 | ○ | ○ |
| Experimental Example 7 | n-Dodecane | Octane butanol 4:1 | 7.61 | 11.42 | 0.95 | 0.15 | ○ | ○ |
| Experimental Example 8 | α-Terpineol | Octane butanol 4:1 | 7.61 | 11.42 | 0.95 | 0.15 | ○ | ○ |
| Experimental Example 9 | n-Hexane | Decane butanol 2:1 | 7.61 | 11.42 | 0.95 | 0.15 | ○ | ○ |
| Experimental Example 10 | n-Decane | Decane hexanol 4:1 | 7.61 | 11.42 | 0.95 | 0.15 | ○ | ○ |
| Experimental Example 11 | n-Dodecane | Octane pentanol 3:1 | 7.61 | 11.42 | 0.95 | 0.15 | ○ | ○ |
| Experimental Example 12 | n-Hexane | Octane hexanol 4:1 | 7.61 | 11.42 | 0.95 | 0.15 | ○ | ○ |
| Experimental Example 13 | n-Decane | Octane butanol 4:1 | 7.61 | 11.42 | 0.47 | 0.15 | ○ | ○ |
| Experimental Example 14 | n-Decane | Octane butanol 4:1 | 7.61 | 11.42 | 1.90 | 0.15 | ○ | ○ |
| Experimental Example 15 | n-Decane | Octane butanol 4:1 | 7.61 | 22.85 | 0.95 | 0.15 | ○ | ○ |

TABLE 2

| | Solvent for synthesis | Solvent of ink | Amount of addition mmol | | | | Production of fine silver particles | Stability of ink |
| --- | --- | --- | --- | --- | --- | --- | --- | --- |
| | | | Diamine | Hexylamine | Dodecylamine | Oleic acid | | |
| Comparative Example 1 | None | Octane butanol 4:1 | 7.61 | 11.40 | 0.95 | 0.15 | ○ | ○ |
| Comparative Example 2 | Chloroform | — | 7.61 | 11.40 | 0.95 | 0.15 | x | — |
| Comparative Example 3 | Water | Octane butanol 4:1 | 7.61 | 11.40 | 0.95 | 0.15 | ○ | x |

TABLE 2-continued

|  | Solvent for synthesis | Solvent of ink | Amount of addition mmol | | | | Production of fine silver particles | Stability of ink |
|---|---|---|---|---|---|---|---|---|
|  |  |  | Diamine | Hexylamine | Dodecylamine | Oleic acid |  |  |
| Comparative Example 4 | n-Tetradecane | Octane butanol 4:1 | 7.61 | 11.40 | 0.95 | 0.15 | ○ | ○ |
| Comparative Example 5 | n-Decane | Octane butanol 4:1 | 22.84 | 11.40 | 0.95 | 0.15 | ○ | x |
| Comparative Example 6 | n-Decane | Octane butanol 4:1 | 7.61 | 11.40 | 0.95 | 0.45 | ○ | ○ |
| Comparative Example 7 | n-Decane | Octane butanol 4:1 | 7.61 | 11.40 | 0.95 | 0.08 | ○ | x |
| Comparative Example 8 | n-Decane | Tetradecane butanol 7:3 | 7.61 | 11.40 | 0.95 | 0.15 | ○ | ○ |

Experimental Examples 1 to 8 and Comparative Examples 2 to 4 are investigations on wetting by various organic solvents, Comparative Example 1 is an investigation on the absence of wetting, and Experimental Examples 9 to 12 and Comparative Example 8 are investigations on the kinds of the organic solvents used for final dispersing. In Experimental Examples 13 to 15 and Comparative Examples 5 to 7, fine silver particle inks are produced by investigating the amounts of addition of N,N-dimethyl-1,3-diaminopropane, hexylamine, dodecylamine, and oleic acid with respect to silver oxalate.

In Experimental Examples 1 to 15, fine silver particle inks can be synthesized, and stable inks that do not produce precipitates for one month or more are obtained. On the other hand, in Comparative Example 2, synthesis of fine silver particles cannot be achieved, and an ink cannot be obtained. Furthermore, in Comparative Examples 3, 5 and 7, fine silver particles can be synthesized; however, thereafter, silver precipitates are generated, and inks having poor stability are obtained.

Table 3 presents the following items of Experimental Examples 1 to 15, and Table 4 presents the following items of Comparative Examples 1 to 8: the molar ratios of hexylamine and dodecylamine included in the fine silver particle inks produced respectively in the Experimental Examples and Comparative Examples, the ratios of mmol of oleic acid and g of silver weight, and the results of volume resistance values (obtainable after heating for 20 minutes and after heating for 120 minutes) obtained when the inks were spin coated on PET films and thereby sintered bodies were formed at 100° C. Also, evaluations made by visually observing the surfaces of the films sintered at 100° C. and rated on the basis of three grades such as mirror surface (○), dullness (Δ), and cloudiness (X), are described in Tables 3 and 4.

TABLE 3

|  | Hexyl/dodecyl (mol/mol) | Oleic acid/Ag (mmol/g) | Volume resistance μΩ · cm | | Mirror surface properties of film after 120 minutes at 100° C. |
|---|---|---|---|---|---|
|  |  |  | After 120 minutes at 100° C. | After 20 minutes at 100° C. |  |
| Experimental Example 1 | 7 | 0.077 | 15.43 | 23.24 | ○ |
| Experimental Example 2 | 6 | 0.073 | 11.99 | 17.82 | ○ |
| Experimental Example 3 | 9 | 0.066 | 9.21 | 11.5 | ○ |
| Experimental Example 4 | 6 | 0.055 | 10.04 | 13.13 | ○ |
| Experimental Example 5 | 7 | 0.080 | 10.37 | 15.32 | ○ |
| Experimental Example 6 | 7 | 0.075 | 22.31 | 12.30 | ○ |
| Experimental Example 7 | 7 | 0.098 | 9.37 | 14.33 | ○ |
| Experimental Example 8 | 6 | 0.092 | 16.63 | 28.71 | ○ |
| Experimental Example 9 | 8 | 0.095 | 15.34 | 27.43 | ○ |
| Experimental Example 10 | 7 | 0.073 | 18.79 | 32.19 | ○ |
| Experimental Example 11 | 5 | 0.078 | 22.38 | 35.64 | ○ |
| Experimental Example 12 | 7 | 0.085 | 13.49 | 19.27 | ○ |
| Experimental Example 13 | 30 | 0.088 | 22.3 | 48.544 | ○ |
| Experimental Example 14 | 3 | 0.040 | 16.9 | 50.108 | ○ |

TABLE 3-continued

|  | Hexyl/dodecyl (mol/mol) | Oleic acid/Ag (mmol/g) | Volume resistance μΩ · cm | | Mirror surface properties of film |
|---|---|---|---|---|---|
|  |  |  | After 120 minutes at 100° C. | After 20 minutes at 100° C. | after 120 minutes at 100° C. |
| Experimental Example 15 | 60 | 0.025 | 20.41 | 49.962 | ○ |

TABLE 4

|  | Hexyl/dodecyl (mol/mol) | Oleic acid/Ag (mmol/g) | Volume resistance μΩ · cm | | Mirror surface properties of film |
|---|---|---|---|---|---|
|  |  |  | After 120 minutes at 100° C. | After 20 minutes at 100° C. | after 120 minutes at 100° C. |
| Comparative Example 1 | 8 | 0.051 | 25.52 | 64.74 | Δ |
| Comparative Example 2 | — | — | — | — | — |
| Comparative Example 3 | — | — | — | — | — |
| Comparative Example 4 | 6 | 0.095 | 51268 | 3294100 | X |
| Comparative Example 5 | 11 | 0.030 | — | — | — |
| Comparative Example 6 | 5 | 0.328 | 59144000 | 41541500 | X |
| Comparative Example 7 | 6 | 0.020 | 12.59 | 16.773 | ○ |
| Comparative Example 8 | 7 | 0.070 | 336.18 | 1978000 | X |

The ratios of hexylamine and dodecylamine for Experimental Examples 1 to 15 in which stable fine silver particle inks could be synthesized were 3 to 60, and the amount of oleic acid was in the range of 0.025 to 0.098 mmol/g relative to the weight of silver. Furthermore, in Experimental Examples 1 to 15, the volume resistance values obtained when the fine silver particle inks were spin coated on PET substrates and sintered at 100° C. were 50.108 μΩ·cm or less in 20 minutes. Thus, the electrical resistance was decreased in a short time, and silver films having mirror surfaces were obtained.

On the other hand, in Comparative Example 1 produced without wetting silver oxalate with a solvent, a stable fine silver particle ink can be obtained, but the volume resistance value obtained when the ink was spin coated on a PET substrate and then sintered at 100° C. is more than 60 μΩ·cm in 20 minutes. Thus, the decrease in the volume resistance is slower than the case of producing the fine silver particle ink by wetting; Furthermore, even if the ink is heated for 120 minutes, a volume resistance of less than 25 μΩ·cm is not obtained. Also, the silver film surface obtained after sintering was dull.

In Comparative Example 4, a film having very high volume resistance and low electrical conductivity is obtained. In this Example, a fine silver particle ink was synthesized by wetting silver oxalate with tetradecane. However, it is speculated that even though a final ink state was achieved, since a slight amount of tetradecane was remaining in the ink, when the ink is sintered at 100° C., tetradecane having a high boiling point remains behind and prevents a decrease in the electrical resistance. Also, the silver film surface obtained after sintering was cloudy.

Comparative Example 5 is an ink produced using N,N-dimethyl-1,3-diaminopropane in an amount of addition three times the usual amount, and by decane wetting. Thus, synthesis of a fine silver particle ink is possible, but the ink stability is poor. This is speculated to be because a large amount of N,N-dimethyl-1,3-diaminopropane is adsorbed as a protective agent to the surfaces of the fine silver particles, and the amount of adsorption of other protective agents is not sufficient.

Comparative Example 6 was produced by decane wetting and using oleic acid in an amount of addition three times the usual amount, and thus a fine silver particle ink having very high stability is obtained. The amount of oleic acid in the ink is 0.3 mmol/g or more relative to the weight of silver, and the amount of oleic acid in the ink is excessively large compared to Experimental Examples 1 to 15. When this is used to form a film, a film having very high volume resistance and low electrical conductivity is obtained. Furthermore, the surface of the silver film obtained after sintering was cloudy.

Comparative Example 7 was a fine silver particle ink produced by decane wetting and using oleic acid in an amount of addition ⅓ times the usual amount. Thus, when a film is formed, the film has low volume resistance and satisfactory electrical conductivity; however, the ink has poor long-term stability, and precipitation occurs in about one month. This is because the amount of oleic acid in the ink is only 0.02 mmol/g relative to the weight of silver.

Comparative Example 8 is a fine silver particle ink produced by decane wetting and using tetradecane/butanol (7:3) as the solvent, and a stable silver ink is obtained. However, since the ink contains a large amount of tetradecane having high boiling point, when a film is formed, a film having very high volume resistance and low electrical conductivity is obtained.

The ratio of hexylamine/dodecylamine included in a final fine silver particle ink was calculated by analyzing the produced fine silver particle ink by gas chromatography. The analysis method is described below.

Column: Stabilwax-DB 30 m×0.25 mm ID, film thickness 0.25 μm

Conditions for temperature rise: 80° C. (retention 5 min) to 200° C. (retention 20 min), temperature rise 20° C./min, injection port temperature: 200° C., split mode (20:1)

Detector temperature: 210° C., FID

Carrier gas: Helium 160 kPa

Injection amount: 1 μL

Figure 5:
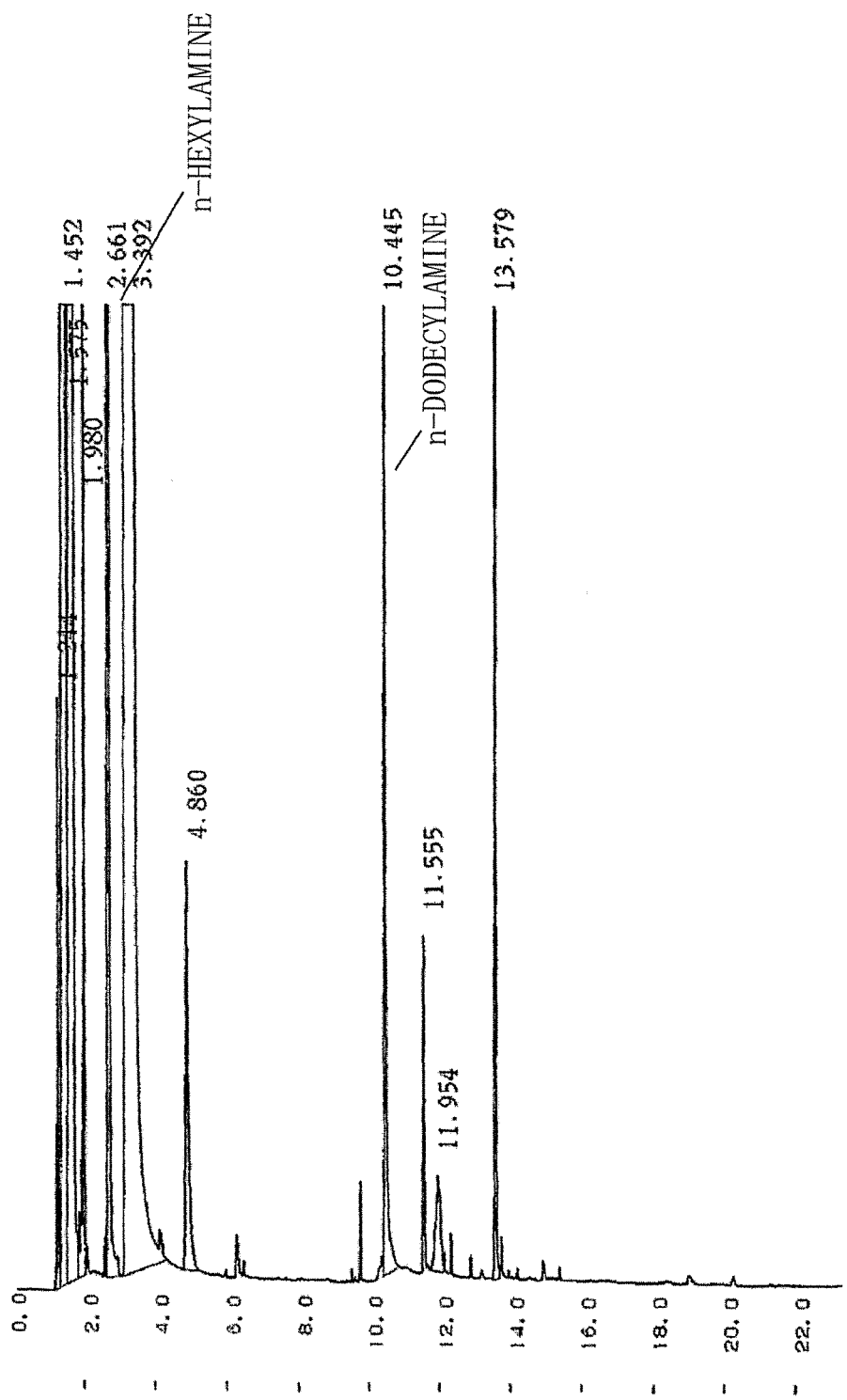
FIG. 5 is a gas chromatographic chart diagram at the time of amine quantification of a coated fine silver particle ink produced by the present invention.

When a sample is analyzed by the above-described method, a peak originating from hexylamine is detected at 2.45 to 2.65 min., a peak originating from diamine is detected at 3.10 to 3.30 min. (not shown in FIG. 5), and a peak originating from dodecylamine is detected at 10.40 to 10.50 min. (FIG. 5). The concentrations of the various protective agents included in an Ag ink were determined from these peak areas and calibration curves produced in advance.

The ratio of the moles of oleic acid and the weight of silver included in a final fine silver particle ink was calculated by analyzing the produced fine silver particle ink by gas chromatography. The analysis method is described below.

Column: Stabilwax-DA 30 m×0.25 mm ID, film thickness 0.25 μm

Column temperature: 250° C.

Injection port temperature: 250° C., split mode (20:1)

Detector temperature: 230° C., FID

Carrier gas: Helium 160 kPa

Injection amount: 1 μL

When a sample is analyzed by the above-described method, a peak originating from oleic acid is detected at 11.90 to 12.35 min. (FIG. 6). The concentrations of various protective agents included in an Ag ink were determined from this peak area and a calibration curve produced in advance.

INDUSTRIAL APPLICABILITY

The fine silver particle ink according to the present invention is such that when the ink is applied and sintered, the sintered body of a coating film has low volume resistance and has a mirror surface. Therefore, the fine silver particle ink can be used for electroconductive silver wiring in a printed wiring board. Furthermore, since the sintered body has a mirror surface, an optically reflective surface can be easily formed.

The invention claimed is:

1. A method for producing a silver particle ink, the method comprising:
   a first step of kneading silver oxalate and N,N-dimethyl-1,3-diaminopropane;
   a second step of kneading the kneading product obtained in the first step with hexylamine, dodecylamine and oleic acid, and thereby forming a silver complex;
   a third step of heating and stirring the silver complex, and thereby producing fine silver particles; and
   a dispersion step of dispersing the fine silver particles obtained in the third step in a solvent to form an ink, wherein the silver oxalate is wetted with 30 to 200 wt % of a solvent in advance.

2. The method for producing a silver particle ink according to claim 1, wherein the silver oxalate comprises, as a silver raw material, a silver oxalate that has been wetted with an organic solvent which has a boiling point of 60° C. to 230° C. and does not contain a halogen compound, in an amount in the range of 30 to 200 wt %.

3. The method for producing a silver particle ink according to claim 1, wherein the heating and stirring in the third step is continued until the silver complex turns black, and gas bubbles are no longer generated from the reaction system.

4. The method for producing a silver particle ink according to claim 1, the method comprising a centrifugation step that includes at least two iterations of a process of separating the N, N-dimethyl-1, 3-diaminopropane, hexylamine, dodecylamine and oleic acid that are not adsorbed to the fine silver particles as protective agents, by adding an alcohol to a matrix containing the fine silver particles produced in the third step, centrifuging the matrix, and then removing the supernatant.

5. The method for producing a silver particle ink according to claim 3, the method comprising a centrifugation step that includes at least two iterations of a process of separating the N, N-dimethyl-1, 3-diaminopropane, hexylamine, dodecylamine and oleic acid that are not adsorbed to the fine silver particles as protective agents, by adding an alcohol to a matrix containing the fine silver particles produced in the third step, centrifuging the matrix, and then removing the supernatant.

6. The method of producing a silver particle ink according to claim 2, the method comprising a centrifugation step that includes at least two iterations of a process of separating the N, N-dimethyl-1, 3-diaminopropane, hexylamine, dodecylamine and oleic acid that are not adsorbed to the fine silver particles as protective agents, by adding an alcohol to a matrix containing the fine silver particles produced in the third step, centrifuging the matrix, and then removing the supernatant.

* * * * *